US011600355B2

United States Patent
Ingram et al.

(10) Patent No.: US 11,600,355 B2
(45) Date of Patent: Mar. 7, 2023

(54) MONITORING AND ADJUSTING ACCESS OPERATIONS AT A MEMORY DEVICE

(71) Applicant: Micron Technology, Inc., Boise, ID (US)

(72) Inventors: Mark D. Ingram, Boise, ID (US);
Todd Jackson Plum, Boise, ID (US);
Scott E. Schaefer, Boise, ID (US);
Aaron P. Boehm, Boise, ID (US);
Scott D. Van De Graaff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/365,003

(22) Filed: Jul. 1, 2021

(65) Prior Publication Data

US 2022/0036960 A1    Feb. 3, 2022

Related U.S. Application Data

(60) Provisional application No. 63/057,779, filed on Jul. 28, 2020.

(51) Int. Cl.
*G11C 29/44* (2006.01)
*G11C 29/12* (2006.01)
*G06F 12/02* (2006.01)

(52) U.S. Cl.
CPC ...... *G11C 29/4401* (2013.01); *G06F 12/0238* (2013.01); *G11C 29/12005* (2013.01);
(Continued)

(58) Field of Classification Search
CPC .......... G11C 29/4401; G11C 29/12005; G11C 29/12015; G11C 2207/2254;
(Continued)

(56) References Cited

U.S. PATENT DOCUMENTS

2010/0180150 A1* 7/2010 Jeddeloh ............. G06F 11/3058
714/E11.054
2014/0297892 A1* 10/2014 Kaigawa ............... G06F 3/1292
710/5

(Continued)

FOREIGN PATENT DOCUMENTS

KR    20190053486 A    5/2019

OTHER PUBLICATIONS

ISA/KR, International Search Report and Written Opinion of the International Searching Authority, Int'l Appl. No. PCT/US2021/040333, dated Oct. 26, 2021, Korean Intellectual Property Office, Seo-gu, Daejeon, Republic of Korea, 9pgs.

*Primary Examiner* — Fernando Hidalgo
(74) *Attorney, Agent, or Firm* — Holland & Hart, LLP

(57) ABSTRACT

Methods, systems, and devices for monitoring and adjusting access operations at a memory device are described to support integrating monitors or sensors for detecting memory device health issues, such as those resulting from device access or wear. The monitoring may include traffic monitoring of access operations performed at various components of the memory device, or may include sensors that may measure parameters of components of the memory device to detect wear. The traffic monitoring or the parameters measured by the sensors may be represented by a metric related to access operations for the memory device. The memory device may use the metric (e.g., along with a threshold) to determine whether to adjust a parameter associated with performing access operations received by the memory device, in order to implement a corrective action.

25 Claims, 9 Drawing Sheets

(52) U.S. Cl.
CPC ........... *G11C 29/12015* (2013.01); *G06F 2212/7201* (2013.01); *G06F 2212/7211* (2013.01); *G11C 2207/2254* (2013.01)

(58) Field of Classification Search
CPC ... G11C 29/021; G11C 29/022; G11C 29/023; G11C 29/026; G11C 29/028; G11C 29/24; G11C 29/81; G11C 2029/0409; G11C 29/52; G06F 12/0238; G06F 2212/7201; G06F 2212/7211; G06F 12/0292; G06F 2212/7206; Y02D 10/00
USPC ........................................... 365/185.09
See application file for complete search history.

(56) References Cited

U.S. PATENT DOCUMENTS

| | | | |
|---|---|---|---|
| 2016/0005488 A1* | 1/2016 | Han | G11C 16/20 365/185.18 |
| 2017/0315879 A1* | 11/2017 | Park | G06F 11/1469 |
| 2019/0188376 A1 | 6/2019 | Marcu et al. | |
| 2020/0201718 A1 | 6/2020 | Richter et al. | |
| 2021/0073037 A1* | 3/2021 | Arora | G11C 11/406 |
| 2021/0127249 A1* | 4/2021 | Oh | G06F 1/3215 |

\* cited by examiner

MONITORING AND ADJUSTING ACCESS OPERATIONS AT A MEMORY DEVICE

CROSS REFERENCE

The present application for patent claims the benefit of U.S. Provisional Patent Application No. 63/057,779 by INGRAM et al., entitled "MONITORING AND ADJUSTING ACCESS OPERATIONS AT A MEMORY DEVICE," filed Jul. 28, 2020, assigned to the assignee hereof, and expressly incorporated by reference herein.

BACKGROUND

The following relates generally to one or more systems for memory and more specifically to monitoring and adjusting access operations at a memory device.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
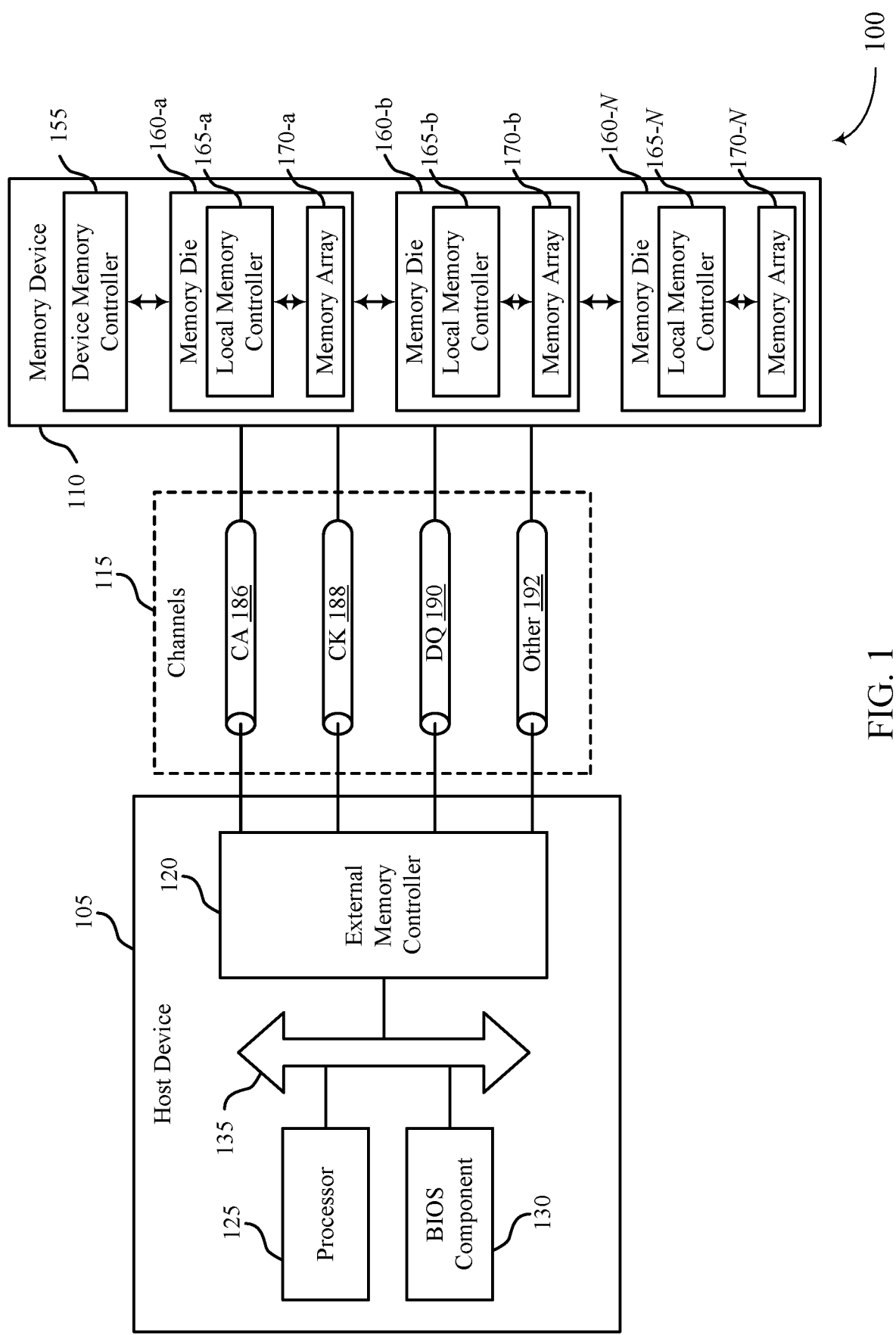
FIG. 1 illustrates an example of a system that supports monitoring and adjusting access operations at a memory device in accordance with examples as disclosed herein.

Memory device health or reliability may be impacted by normal device use, by heavy device use, or by an "aggressor" attack on the memory device (e.g., an access pattern intended to disturb one or more bits in a memory array to gain unauthorized access to the memory device or other systems, referred to generally as row hammer). Reduced reliability may include degradation of circuits (e.g., including degradation of one or more transistors) or compromised data integrity via repeated access operations (e.g., a row hammer). In one example, row access circuits may use higher voltages (e.g., higher than a supply voltage or logic voltage) and may be more susceptible to transistor degradation, which may lead to a shorter reliable lifetime of an associated memory device (e.g., due to chip failure). Memory devices may be designed for a worst case scenario (e.g., any operation scenario), but designing to handle a worst case scenario may increase device cost and reduce device performance, and may, for example, still lead to reliability problems. The lack of real-time reporting (e.g., reporting from the memory device while in use) for memory device component characteristics and/or metrics may reduce the ability to handle adverse conditions or to determine device performance issues caused by wear. In some systems, such as in applications with data security or safety implications (e.g., client devices, mobile devices, servers, device networks, or autonomous vehicles), the lack of real-time reporting may result in unwanted data security and/or reliability issues.

The present disclosure provides techniques for integrating monitors or sensors for detecting memory device health issues, such as those resulting from device access and/or wear. The memory device may be configured to warn a host device (e.g., a source external to the memory device) of performance issues (e.g., possible wear-out or performance degradation) or of a possible attack, and the host device or the memory device may be configured to implement a corrective action to counteract or deter the detected issues or attack. The monitoring may include traffic monitoring of access operations performed at various components of the memory device, or may include sensors that may measure parameters of components (e.g., transistors) of the memory device to detect wear. The sensors may measure path speed degradation, impedance drift, or setup/hold timing degradation, among other examples. The traffic monitoring or the parameters measured by the sensors may be represented by a metric related to access operations for the memory device. The memory device and/or host device may use the metric (e.g., along with a threshold) to determine whether to adjust a parameter associated with performing access operations received by the memory device, for example, in order to implement a corrective action.

While some examples of health status reporting are described herein with reference to some volatile capacitive memory systems, it is to be understood that the same examples may apply to non-volatile memory systems, such as capacitive, resistive, ferroelectric, magnetic, magnetoresistive, or phase change memory systems.

Features of the disclosure are initially described in the context of systems and dies as described with reference to FIGS. 1 and 2. Features of the disclosure are described in the context of memory device architectures and a flow diagram as described with reference to FIGS. 3-5. These and other features of the disclosure are further illustrated by and described with reference to an apparatus diagram and flowcharts that relate to monitoring and adjusting access operations at a memory device as described with reference to FIGS. 7-9.

FIG. 1 illustrates an example of a system 100 that supports monitoring and adjusting access operations at a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110). In some cases, the memory subsystem or system 100 may be referred to as a memory device or memory devices.

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device (e.g., graphics processing unit (GPU)), a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105. A host device 105 may be configured to receive device monitoring reports (e.g., access traffic or component wear reports) from the memory device 110 and determine whether to take a corrective action to mitigate issues indicated via the device monitoring reports. In some cases, the host device 105 may configure the memory device 110 with a reporting configuration (e.g., for transmitting or determining to transmit the device monitoring reports).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some cases, health or reliability of a memory device 110 may be impacted by normal device use, by heavy device use, or by an attack on the memory device. According to aspects described herein, the memory device 110 may include monitors or sensors for detecting memory device health issues, such as those resulting from device access and/or wear. The memory device 110 may be configured to warn a host device 105 (e.g., a source external to the memory device) of performance issues (e.g., possible wear-out or performance degradation) or of a possible attack (e.g., an action that exceeds expected use or specifications in order to cause a device to malfunction or operate outside of an intended mode), and the host device 105 or the memory device 110 may be configured to implement a corrective action to counteract or deter the detected issues or attack.

Figure 2:
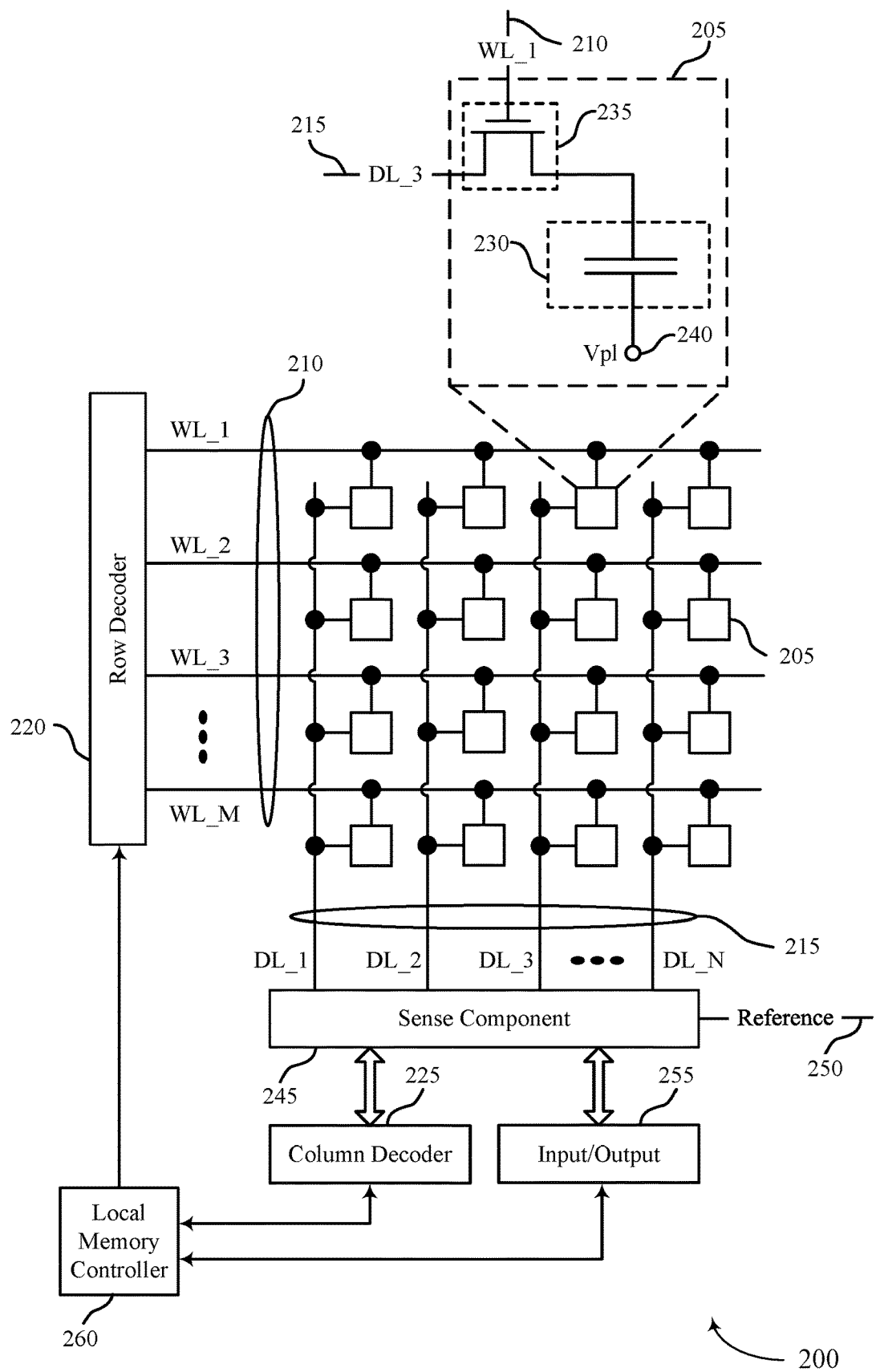
FIG. 2 illustrates an example of a memory die that supports monitoring and adjusting access operations at a memory device in accordance with examples as disclosed herein.

FIG. 2 illustrates an example of a memory die 200 that supports monitoring and adjusting access operations at a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235 (e.g., an access transistor or a cell access transistor). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and/or writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 (e.g., a row driver) or a column decoder 225 (e.g., a column driver). For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

Some components of a memory device may be impacted by normal device use, by heavier device use, or by an attack on the memory device. For example, a row decoder 220, column decoder 225, switching component 235, or capacitor 230, among other examples, may experience repeated or high-duty cycle use that may cause component wear. According to various aspects, the memory device may include monitors or sensors for detecting memory device health issues, such as those resulting from device access and/or wear. The memory device may be configured to warn a host device (e.g., a source external to the memory device) of performance issues (e.g., possible wear-out or performance degradation) or of a possible attack, and the host device or the memory device may be configured to implement a corrective action to counteract or deter the detected issues or attack.

Figure 3:
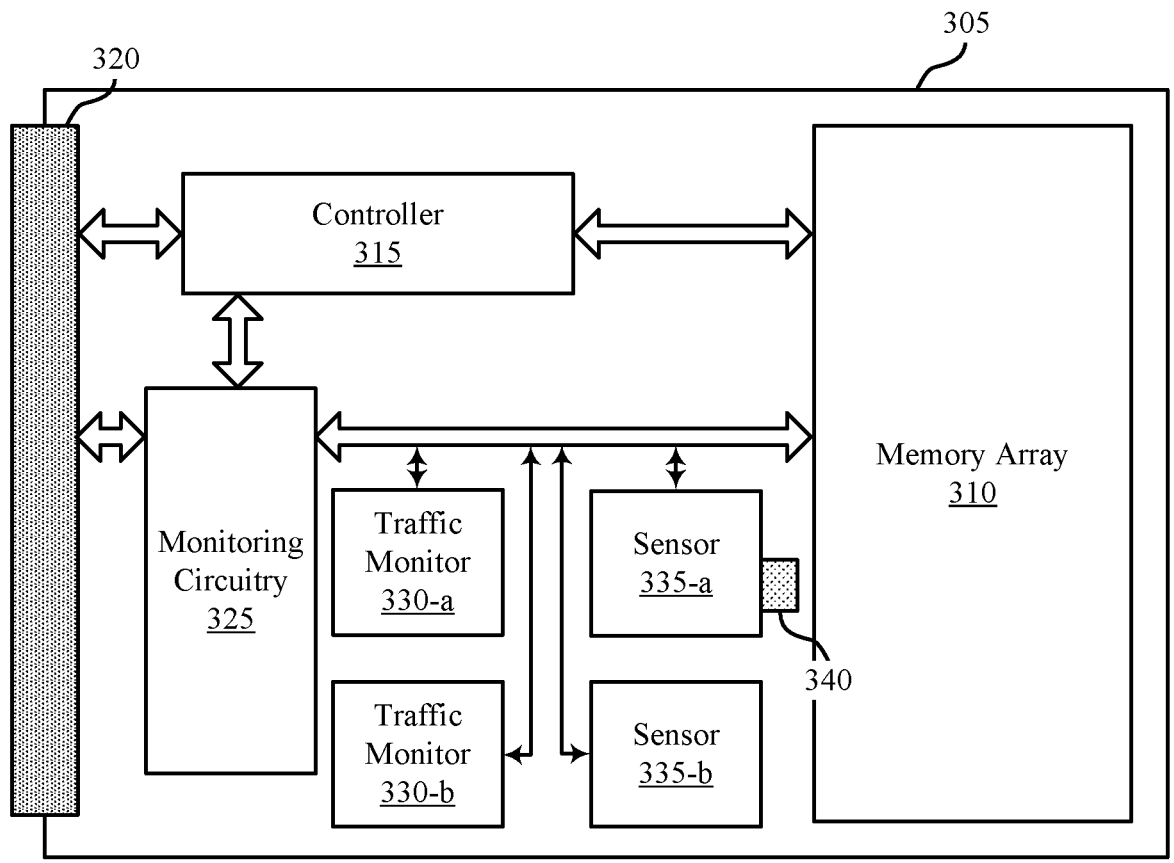
FIG. 3 illustrates an example of a memory device architecture that supports monitoring and adjusting access operations at a memory device in accordance with examples as disclosed herein.

FIG. 3 illustrates an example of a memory device architecture 300 that supports monitoring and adjusting access operations at a memory device in accordance with examples as disclosed herein. Memory device architecture 300 may include a memory device 305, which may be an example of or include aspects of a memory device 110 as described with reference to FIG. 1 or a memory die 200 as described with reference to FIG. 2. In some examples, memory device 305 may be an example of a silicon memory device.

Memory device 305 may include a memory array 310, which may be an example of aspects of a memory array 170 as described with reference to FIG. 1, or an array as described with reference to FIG. 2. The memory array 310 may be a collection (e.g., one or more grids, one or more banks, one or more tiles, one or more sections) of memory cells, with each memory cell being operable to store at least one bit of data.

Memory device 305 may also include a controller 315 coupled with the memory array 310. The controller 315 may be an example of aspects of a device memory controller 155 or a local memory controller 165 as described with reference to FIG. 1, or a local memory controller 265 as described with reference to FIG. 2. The controller 315 may be operable to control operation of the memory array 310. For example, the controller 315 may be operable to access one or more memory cells in response to a command received from a source external to the memory device 305 (e.g., a host device), and may in some cases, represent an access component. Controller 315 may also include or be coupled with decoding circuitry, such as one or more row decoders 220 or column decoders 225 as described with reference to FIG. 2, or a command decoder for decoding commands received from a source external to the memory device 305.

The controller 315 may be coupled with communication pads 320 (e.g., CA pads and/or DQ pads) via which the controller 315 may receive data from and transmit data to the source external to the memory device 305 (e.g., a host device). The communication pads 320 may also carry commands (e.g., access commands) and address information associated with the data. The controller 315 may be operable to store the data received via the communication pads 320 in a subset of the memory array 310 (e.g., a subset of the memory cells within the memory array 310). The communication pads 320 may be coupled (e.g., via pins, balls, bond pads, bond wires, or any other type of interconnect, or any combination thereof) with any quantity of electrically conductive materials that may be associated with communication channels 115 as described with reference to FIG. 1, including data channels 190 and CA channels 186, among other examples.

One or more of the communication pads 320 may be coupled with monitoring circuitry 325, where the monitoring circuitry 325 may be configured to monitor one or more health parameters of one or more corresponding systems or subsystems of the memory device 305 (e.g., one or more systems of subsystems of or associated with the memory array 310). The monitoring circuitry 325 may additionally be coupled with the controller 315 and the memory array 310. The monitoring circuitry 325 may monitor one or more health parameters of the memory device 305, such as one or more traffic patterns associated with access operations for the memory device 305 or a level of wear of a component (e.g., a resistor, capacitor, transistor, diode, driver, latch, register, or the like) of the memory device 305. The monitoring circuitry 325 may determine a metric based on or indicative of the one or more traffic patterns, the level of wear, or both.

The monitoring circuitry 325 may be configured to measure a component based on the one or more traffic patterns, the level of wear, or both. For example, the monitoring circuitry 325 may detect repeated access to one or more components that may cause wear in the one or more components. In some cases, the monitoring circuitry 325 may determine an amount of usage (e.g., a value or a level of usage, such as normal, aggressive, or heavy use) of one or more components based on the one or more traffic patterns, the level of wear, or both. Some components or circuits may be more susceptible to wear based on repeated accesses or other factors. For example, circuits that experience or carry higher voltages (e.g., row path or column path circuits) may experience higher wear, or components that experience higher temperatures may experience higher wear. The monitoring circuitry 325 may be configured to detect or determine traffic patterns or wear levels outside of a recommended range for the memory device 305 (e.g., a lower amount of refresh operations), which may result in lower performance and/or shorter device lifetime.

A first example of an access operation (e.g., a traffic pattern of an access operation or a wear resulting from the access operation) that may cause performance issues (e.g., degradation or wear, as represented by the metric) may include a repeated similar access, which may result in a section or row hammer (e.g., a repeated similar access to a memory address). The section or row hammer may result in voltage threshold increases or decreases, or sense amplifier performance loss for one or more sense amplifiers associated with the section or row. A second example of an access operations that may cause performance issues may include expected wear or traffic patterns or one or more environmental conditions (e.g., temperature). Some access patterns or device wear may result in a path slowdown (e.g., a slowdown for a critical clock signal path), an impedance change (e.g., output impedance drift), or a duty cycle degradation (e.g., a setup or hold duty cycle), among other examples, for one or more components of the memory device 305.

The monitoring circuitry 325 may further be configured to determine that a possible aggressor attack (e.g., from a hacker) is taking place, based on the one or more traffic patterns, the level of wear, or both. For example, an unexpected usage pattern or abnormal access pattern (e.g., heavier pattern, heavier wear, or different than expected pattern) may indicate a possible aggressor attack. In some cases, an unexpected event, such as a row hammer, may also be associated with a possible aggressor attack. The monitoring circuitry 325 may be configured to warn a source (e.g., a host device) external to the memory device 305 of the possible aggressor attack. The monitoring circuitry 325 may transmit an indication (e.g., using a channel, such as a side channel) to the source external to the memory device 305 of the possible aggressor attack.

One or more monitoring aspects of the monitoring circuitry 325 may be enabled by information received via the communication pads 320. For example, the source external to the memory device 305 may load or transmit a reporting or monitoring configuration to the memory device 305, which may include an indication of whether to report the metric or other information to the source external to the memory device 305 (e.g., or whether to make one or more determinations at the memory device 305).

The monitoring circuitry 325 may include one or more traffic monitors 330 and one or more sensors 335. The traffic monitors 330 may be configured, for example, to detect access operations performed at one or more components of the memory device 305. Traffic monitors 330 may be examples of circuitry configured to detect access operations, such as a quantity of access operations. In some cases, a sensor 335 may be configured to detect a level of wear or degradation for a component of the memory device 305. The sensors 335 and/or traffic monitors 330 may be coupled with portions of the memory device 305, such as the memory array 310 or a bus thereof. The sensors 335 and/or traffic monitors 330 may be configured per memory row, per memory section, per memory bank, or any combination thereof, such that detected access operations or detected component degradation may indicate a pattern for access traffic. The sensors 335 and/or traffic monitors 330 may additionally or alternatively be configured for non-array areas, such as for charge pumps for power supplies (e.g., one sensor 335 for each of multiple charge pumps), spare logic sections, or any combination thereof, in order to detect access operations or component degradation associated with a pattern for access traffic.

In some cases, a sensor 335 may include a replica component 340 that may be configured to degrade at a higher rate than an associated device component (e.g., the replica component 340 may be more prone to wear or may be overdriven). The replica component 340 may thus indicate a wear condition of the associated component, for example, based on a voltage threshold or output impedance degradation of the replica component 340, which may precede a voltage threshold or output impedance degradation of the associated component (e.g., because of the higher rate of degradation).

The monitoring circuitry 325 may, in some cases, combine sensor readings to determine an amount of degradation or identify a performance issue (e.g., identify the metric). For example, combinations of sensor readings for temperature, degradation, a traffic pattern, or any combination thereof may be used to identify a performance issue. In identifying the performance issue the different sensor readings may be considered together, for example, by considering their effect on one another or by considering effects caused by different ranges of sensor readings.

If the monitoring circuitry 325 is configured to communicate traffic information or wear information to the source external to the memory device 305, the monitoring circuitry 325 may communicate (e.g., via the communication pads 320) the one or more performance issues, or the metric indicative thereof, to the source external to the memory device 305. In some cases, the source external to the memory device 305 may use the information to determine and indicate (e.g., to the memory device 305) a corrective action for the memory device 305 to perform. If the monitoring circuitry 325 is not configured to communicate health traffic information or health wear information to the source external to the memory device 305 (e.g., refrain from communicating), the monitoring circuitry 325 may not communicate the one or more performance issues, or the metric indicative thereof, to the source external to the memory device 305. For example, the monitoring circuitry 325 may determine a corrective action to perform based on the information.

Figure 4:
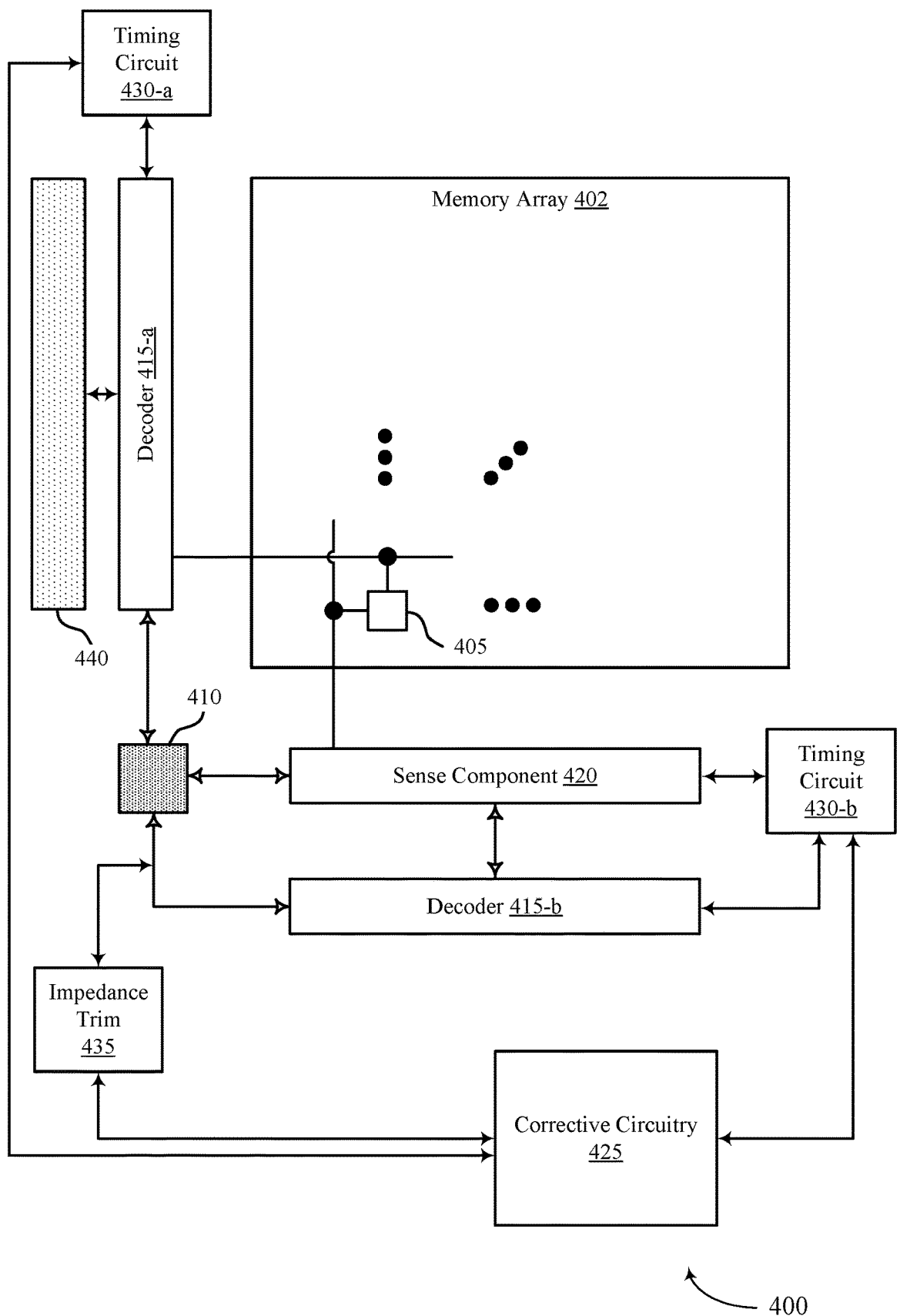
FIG. 4 illustrates an example of a memory device architecture that supports monitoring and adjusting access operations at a memory device in accordance with examples as disclosed herein.

Corrective actions are further described herein with reference to FIG. 4, and may be configured to reduce a wear on one or more components of the memory device 305 and increase the life of the memory device 305 (e.g., or a component thereof).

In some cases, a system or subsystem (e.g., component) associated with the metric may be encoded when transmitted, such that the memory device 305 may determine the system or subsystem, while the source external to the memory device 305 may not have access to the information of which system or subsystem is indicated. For example, the source external to the memory device 305 may receive an indication of a metric or one or more performance issues for a subsystem "A," but may not have information as to what subsystem is represented by subsystem "A." In some cases, the source external to the memory device 305 may have access to information to support identification of mission critical systems or subsystems reported by the memory device 305.

FIG. 4 illustrates an example of a memory device architecture 400 that supports monitoring and adjusting access operations at a memory device in accordance with examples as disclosed herein. Memory device architecture 400 may include portions of a memory device, which may be an example of or include aspects of a memory device 110 as described with reference to FIG. 1, a memory die 200 as described with reference to FIG. 2, or a memory device 305 as described with reference to FIG. 3.

The memory device may include a memory array 402, which may be an example of aspects of a memory array 170 as described with reference to FIG. 1, or an array as described with reference to FIG. 2. The memory array 402 may be a collection (e.g., one or more grids, one or more banks, one or more tiles, one or more sections) of memory cells 405, with each memory cell 405 being operable to store at least one bit of data. While one memory cell 405 is illustrated herein, it is to be understood that the memory array 402 may include any quantity of memory cells 405, and that the examples described herein with respect to the memory cell 405 may apply to any memory cell of the memory array 402.

The memory device may include multiple pins or pads 410, as described with reference to FIG. 2. As described herein, a pad 410 may represent any pin or pad included in the memory device, such as a data pad or an address pad (e.g., a command/address (C/A) pad). A pad 410 may be coupled with one or more traces or electrical conductors between the memory device and a source external to the memory device, such that the pad 410 may be used to transmit data to and from the source external to the memory device. A pad 410 may be coupled (e.g., directly or indirectly) with one or more decoders 415 (e.g., drivers), such as a row decoder 415 and/or a column decoder 415, which may be configured to access one or more memory cells 405. For example, a row decoder 415-a and a column decoder 415-b may be used to access a memory cell 405 at an intersection of a row and column.

A logic value of the memory cell may be sensed and output by a sense component 420 (e.g., a sense amplifier), which may be coupled (e.g., directly or indirectly) with the pad 410. The pad 410 may therefore transmit, to the source external to the memory device, an indication of the logic value (e.g., data) output by the sense component 420.

As described with reference to FIG. 3, monitoring circuitry of the memory device may be configured to monitor traffic patterns and/or component degradation for the components described herein (e.g., the decoders 415 and the sense component 420), and for other components of the memory device. For example, the monitoring circuitry may determine one or more metrics for a component of the memory device, where the one or more metrics may be indicative of an amount of traffic or a level of wear of the component. As described herein, the amount of traffic and the level of wear may be associated with access operations performed using the components of the memory device.

The memory device may include one or more sensors for determining the metric associated with the level of wear or the traffic pattern for a component (e.g., as a part of the monitoring circuitry). For example, a sensor may measure temperature or a level of wear, among other examples. In some cases, a sensor for a level of wear may be represented by a replica circuit 440, which may replicate one or more components of the memory device. For example, replica circuit 440 may replicate portions of a decoder 415, portions of a memory cell 405, or portions of a sense component 420, among other examples. A replica circuit 440 may degrade in a manner that is proportional to an operational service time of the associated component or may degrade proportional to a quantity of times the associated component is accessed, used, or driven.

The degradation of the replica circuit 440 may be measured by a voltage shift of one or more voltage thresholds of the replica circuit 440, and may, for example, be used to determine the metric associated with the component. For example, the replica circuit 440 may provide (e.g., via a voltage threshold level) an indication of an amount of accesses of the component or an indication of an amount of wear or degradation of the component. In some cases, a replica circuit 440 may be overdriven (e.g., driven at a higher voltage or for a longer time) such that the one or more voltage threshold levels of the replica circuit 440 may degrade or wear faster than the associated component (e.g., in order to read or determine the voltage threshold change of the replica circuit 440 more easily or before similar degradation or wear on the associated component). For example, a replica circuit 440 may include similar devices as memory cell 405, but may be driven at higher voltages each time an access is performed on one or more rows or regions of the memory device. In some cases, a replica circuit 440 (e.g., a sensor) may be measured by a component (e.g., sensor 335) configured to trigger (e.g., transmit or otherwise indicate) a flag when a quantity of accesses or an amount of degradation or wear is reached (e.g., as represented by a voltage threshold level).

The memory device may also include corrective circuitry 425, which may be configured to implement adjustments to one or more parameters associated with access operations, for example, based on the amount of traffic or the level of wear (e.g., based on the metric). For example, the monitoring circuitry or the corrective circuitry 425 may determine that the metric meets or exceeds a threshold and may determine to implement an adjustment to the one or more parameters based on the metric meeting or exceeding the threshold. The corrective circuitry 425 may include one or more circuits, and in some cases, may be part of the monitoring circuitry or may be different from the monitoring circuitry. In some cases, the corrective circuitry 425 may include logic, such as a microcontroller.

Some examples of parameters that the corrective circuitry 425 may adjust may include modifying a row address term (e.g., scrambling the row address term), adjusting a sense amplifier control voltage or timing, adjusting an internal voltage (e.g., a supply voltage, a well or back-bias voltage) for a component of the memory device, adjusting an output impedance trim, or performing a recalibration procedure for a component of the memory device. The corrective circuitry 425 may adjust a parameter, for example, based on an identified address pattern or level of wear identified by the monitoring circuitry. The corrective circuitry 425 may, for example, include or be coupled with (e.g., indirectly or directly) one or more other circuits of the memory device and may initiate an adjustment to a parameter at the one or more other circuits. In some cases, the corrective circuitry 425 may perform an adjustment based on an indication from the monitoring circuitry, such as an indication of the metric or an indication to perform the adjustment. In some cases, the corrective circuitry 425 may perform an adjustment based on an indication from the source external to the memory device. For example, the monitoring circuitry may notify the source external to the memory device of the metric, and the source external to the memory device may determine a response based on the metric and may indicate the determined response to the memory device (e.g., upon which the corrective circuitry may perform the response).

In a first example, if the monitoring circuitry identifies a repeated similar access that may cause a row or section hammer (e.g., based on the metric or associated information), the corrective circuitry 425 may scramble a memory cell row address term by remapping one or more row addresses to point to different physical memory cell rows within the memory device. The corrective circuitry 425 may additionally or alternatively initiate a row copy procedure to change a location of a row in response to the identified access pattern. For example, the corrective circuitry 425 may be coupled (e.g., directly or indirectly) with the decoders 415 and may initiate a row address scramble and/or row copy at one or more of the decoders 415. In some cases, a row address scramble or a row copy corrective action may result in a reset or a re-initialization of the memory device (e.g., or a portion thereof) by the source external to the memory device.

In a second example, if the monitoring circuitry identifies a repeated similar access that may cause performance loss to the sense component 420 (e.g., a sense amplifier), the corrective circuitry 425 may initiate an adjustment to a control voltage or a timing. For example, a sense amplifier may experience voltage threshold shift to a higher or lower voltage over time, and the corrective circuitry 425 may initiate an adjustment to the control voltage to a higher voltage or lower voltage or may adjust an amount of time taken to sense data (e.g., via a timing circuit 430), among other timing adjustment examples. In some cases, timing adjustments may be initiated via a timing circuit 430 (e.g., timing circuit 430-a or 430-b).

In a third example, if the monitoring circuitry identifies a path slowdown (e.g., a clock signal critical path slowdown), the corrective circuitry 425 may adjust an internal voltage for the path, such as a supply voltage or well voltage. For example, the monitoring circuitry may identify that one or more transistors on the path are performing actions at a reduced speed (e.g., a slowdown), and the corrective circuitry 425 may initiate an increase or decrease to a back-bias voltage (e.g., a well voltage, such as an n-well or a p-well voltage) of the one or more transistors, which may increase speed for the one or more transistors.

In a fourth example, if the monitoring circuitry identifies an impedance shift of one or more components (e.g., an output impedance drift), the corrective circuitry 425 may adjust an impedance trim (e.g., via an impedance trim component 435). For example, the monitoring circuitry may identify an impedance drift for an output path (e.g., between the sense component 420 and the pad 410), and the corrective circuitry 425 may initiate an adjustment to the output impedance trim of the output path (e.g., by adjusting a quantity of transistors associated with the output path).

In a fifth example, if the monitoring circuitry identifies a reduced or insufficient rate of refresh for the memory cells 405 (e.g., insufficient auto refresh commands from the source external to the memory device), the corrective circuitry 425 may adjust a ratio of refresh operations to row accesses (e.g., in combination with the source external to the memory device).

In a sixth example, if the monitoring circuitry identifies a degradation in a duty cycle (e.g., a setup or a hold duty cycle) for a component, the corrective circuitry 425 may initiate a recalibration (e.g., in combination with the source external to the memory device) to retrain the duty cycle. For example, the memory device may indicate, to the source external to the memory device, a flag to trigger the recalibration, and the source external to the memory device may schedule the recalibration (e.g., within a down time). In some examples, the recalibration may adjust a timing trim, such as an input/output (I/O) timing trim (e.g., via a timing circuit 430).

While several examples of issues associated with an access pattern or a component wear are described herein, it is to be understood that the issues and the corrective actions described herein do not represent an exhaustive list. For example, other issues associated with an access pattern or with component wear may be identified and addressed by the monitoring circuitry and/or corrective circuitry 425 without departing from the scope of the present disclosure.

Figure 5:
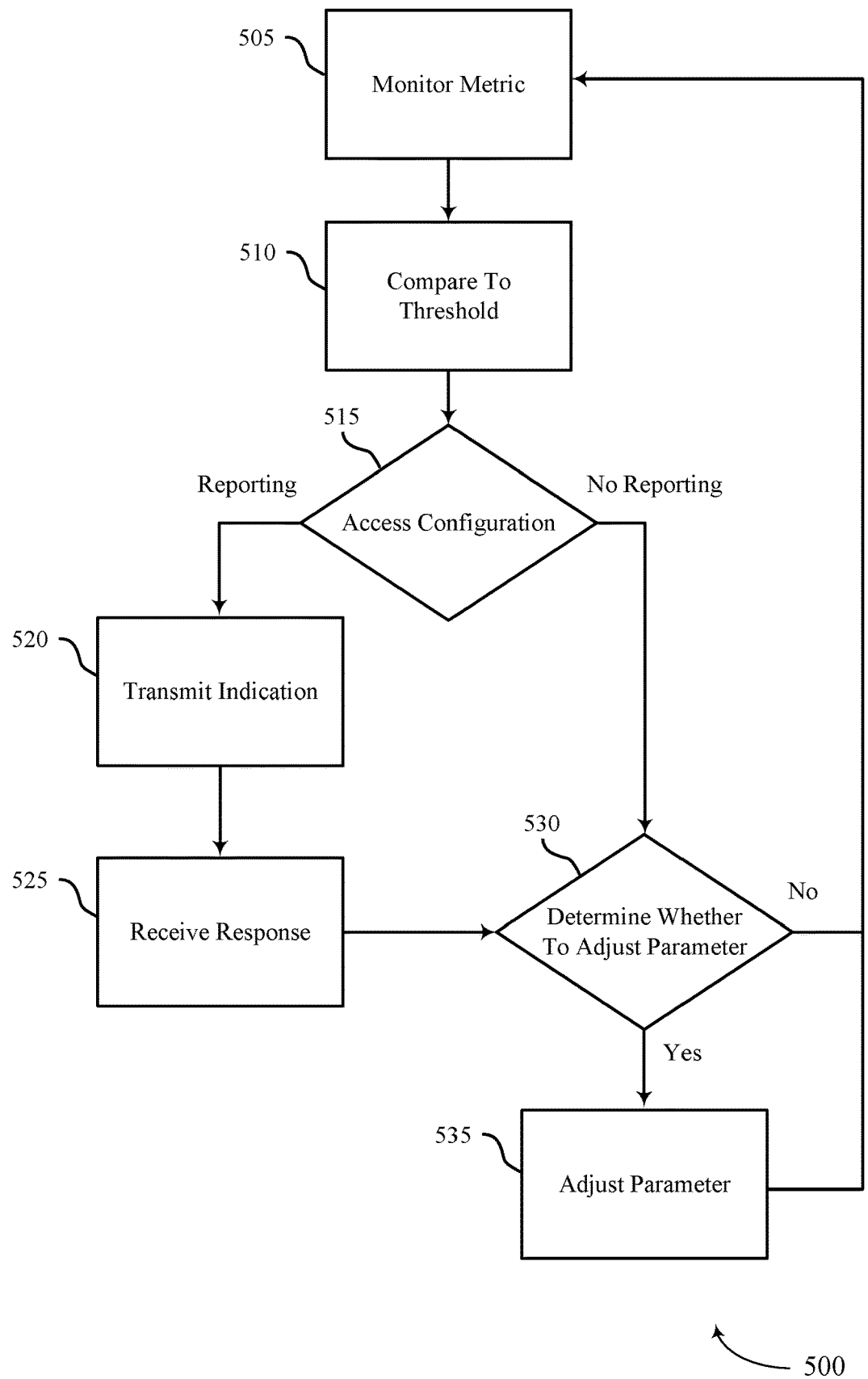
FIG. 5 illustrates an example of a flow diagram that supports monitoring and adjusting access operations at a memory device in accordance with examples as disclosed herein.

FIG. 5 illustrates an example of a flow diagram 500 that supports monitoring and adjusting access operations at a memory device in accordance with examples as disclosed herein. Flow diagram 500 may be implemented by a memory device, which may represent a memory device described with reference to FIGS. 1-4. Flow diagram 500 may be implemented by the memory device, for example, to monitor access traffic patterns and/or component wear within the memory device and determine whether to adjust a parameter of the memory device in response to the monitored traffic patterns and/or component wear.

For example, as described herein with respect to FIGS. 3 and 4, the memory device may include monitoring circuitry which may be coupled with or include corrective circuitry. The monitoring circuitry may monitor access traffic patterns and component wear within the memory device and the monitoring circuitry, the corrective circuitry, or a source external to the memory device, or any combination thereof, may determine whether to adjust one or more parameters associated with performing access operations received by the memory device (e.g., from the source external to the memory device).

At 505, the memory device (e.g., or the monitoring circuitry that forms part of the memory device) may monitor access traffic patterns and/or component wear for one or more components of the memory device. For example, the memory device may monitor a metric for each of the one or more components of the memory device, where the metric may be indicative of an amount of accesses or a level of wear for the corresponding component. The memory device may monitor the metric according to one or more examples described herein. For example, the memory device may monitor the metric using one or more traffic monitors, one or more sensors, or any combination thereof. In some examples, the one or more sensors may include one or more replica circuits configured to degrade according to a quantity of accesses or an amount of degradation on an associated component. The memory device may monitor the metric over multiple access operation of the memory device, for example, beginning at device power up.

At 510, the memory device may compare the metric to a threshold, for example, to determine whether to take corrective action or to notify a source external to the memory device. The threshold may represent a quantity of accesses or an amount of degradation or wear, and may be specific to a component or may be general to all components. The memory device may determine that the metric satisfies the threshold, for example, based on the monitoring performed at 505.

At 515, the memory device may identify a configuration for managing access to the memory device based on determining that the metric satisfies the threshold. For example, the memory device may determine whether the configuration specifies for the memory device to report the metric (e.g., or a result thereof, such as the metric satisfying the threshold) to the source external to the memory device. The configuration may represent one or more settings for real time reporting from the memory device to the source external to the memory device (e.g., via a programmable register, such as a mode register).

In some cases, the configuration may specify that the source external to the memory device is configured to make a determination regarding adjusting a parameter associated with access operations received by the memory device. If the configuration specifies for the memory device to report the metric or associated results, the memory device may proceed to 520. If the configuration does not specify to report the metric, or specifies for the memory device to refrain from transmitting the metric, the memory device may refrain from reporting the metric to the source external to the memory device and may proceed to 530. For example, the configuration may specify that the memory device is to make a determination regarding adjusting the parameter associated with access operations received by the memory device.

At 520, the memory device may transmit, to the source external to the memory device, an indication of the metric determined by the memory device. The memory device may transmit the indication according to the configuration for managing access to the memory device, for example, based on being configured to indicate the metric to the source external to the memory device.

At 525, the memory device may receive, from the source external to the memory device, an indication (e.g., a response) to adjust the parameter associated with performing access operations received by the memory device. For example, the source external to the memory device (e.g., a host device) may receive the indication of the metric transmitted by the memory device and may determine whether to respond to the indication of the metric. If responding to the indication of the metric, the source external to the memory device may also determine whether to indicate a recommended action to the memory device (e.g., the adjustment to the parameter). In some cases, a response may indicate an acknowledgement of the reception of the indication of the metric (e.g., and may not include the recommended action). In some cases, the source external to the memory device may include a recommended action within the response, which may indicate, for example, the recommended action to take in response to the determined metric (e.g., may indicate to adjust the parameter).

At 530, the memory device (e.g., or corrective circuitry thereof) may determine whether to adjust the parameter associated with performing access operations received by the memory device. For example, the memory device may determine to make an adjustment to the parameter based on the indication (e.g., response) received from the source external to the memory device. Additionally or alternatively, the memory device may determine to make an adjustment to the parameter based on the metric satisfying the threshold and one or more settings or configurations of the memory device (e.g., related to the metric and the threshold, such as specifying one or more actions to take at different metric values). In some cases, the memory device (e.g., based on the received response on base on its own determination) may determine to not adjust the parameter and may return to 505 and monitor the metric over multiple access operations performed at the memory device. In some cases, the memory device (e.g., based on the received response on base on its own determination) may determine to adjust the parameter and may proceed to 535.

At 535, the memory device may adjust the parameter associated with performing access operations received by the memory device. As described herein with reference to FIGS. 3 and 4, the parameter may include a refresh rate or ratio, a row address mapping, a control voltage, a component timing, an internal voltage (e.g., well voltage) of a component, an impedance trim (e.g., output impedance trim), or a recalibration procedure, among other examples. The memory device (e.g., or corrective circuitry thereof) may adjust the parameter by initiating a change to the parameter, for example, by arming a component to adjust the parameter during a next cycle or next operation. After adjusting the parameter, the memory device may return to 505 and monitor the metric over multiple access operations of the memory device.

Figure 6:
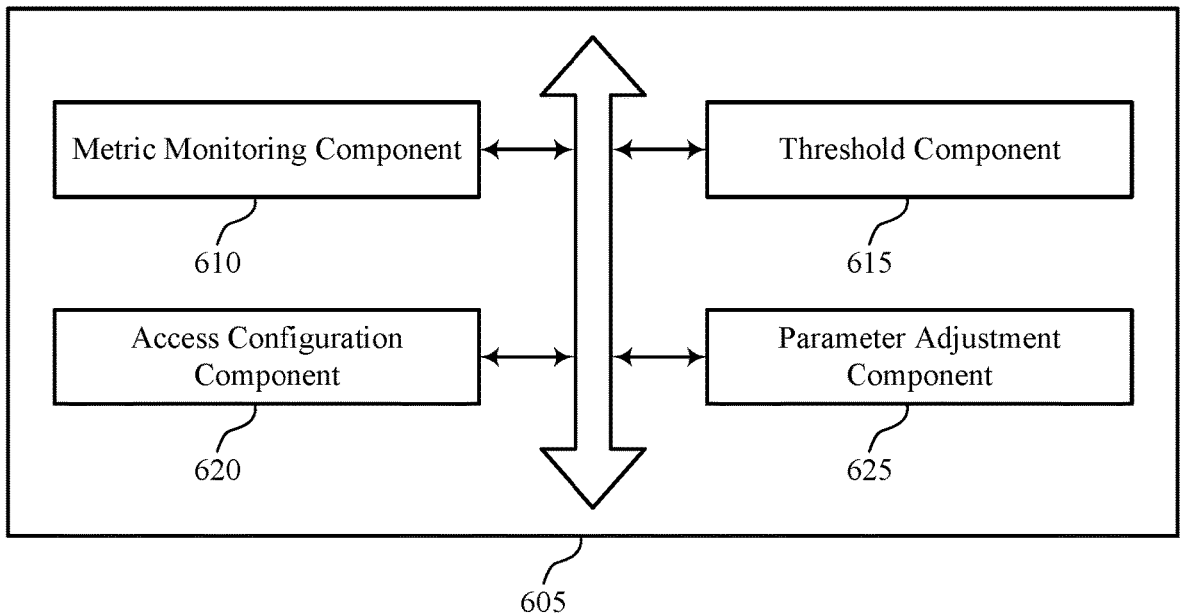
FIG. 6 shows a block diagram of a memory device that supports monitoring and adjusting access operations at a memory device in accordance with examples as disclosed herein.

FIG. 6 shows a block diagram 600 of a memory device 605 that supports monitoring and adjusting access operations at a memory device in accordance with examples as disclosed herein. The memory device 605 may be an example of aspects of a memory device as described with reference to FIGS. 1-5. The memory device 605 may include a metric monitoring component 610, a threshold component 615, an access configuration component 620, and a parameter adjustment component 625. Each of these modules may communicate, directly or indirectly, with one another (e.g., via one or more buses).

The metric monitoring component 610 may monitor, over a set of access operations of a memory device, a metric related to an access operation for the memory device.

In some examples, the metric monitoring component 610 may determine the level of wear of the component based on a measurement of a property of the component with a sensor, where a stress on the component for each of the set of access operations exceeds a stress on a corresponding component in an access path for the set of access operations.

In some cases, the metric represents an access pattern of the memory device over the set of access operations. In some cases, the access pattern indicates a repeated access of an address of the memory device. In some cases, the metric indicates a degradation in performance of a component of the memory device. In some cases, the metric represents a level of wear of a component of the memory device.

The threshold component 615 may determine, based on monitoring the metric, that the metric satisfies a threshold.

The access configuration component 620 may identify a configuration for managing access to the memory device based on determining that the metric satisfies the threshold. In some examples, the access configuration component 620 may transmit, to a source external to the memory device and according to the configuration for managing access to the memory device, an indication of the metric.

In some examples, the access configuration component 620 may receive, from the source external to the memory device and based on transmitting the indication of the metric, an indication to adjust the parameter associated with performing access operations received by the memory device, where determining whether to adjust the parameter associated with performing access operations received by the memory device is based on receiving the indication to adjust the parameter.

The parameter adjustment component 625 may determine whether to adjust a parameter associated with performing access operations received by the memory device based on the metric satisfying the threshold and the configuration for managing access to the memory device. In some examples, the parameter adjustment component 625 may modify a mapping of a logical address to a physical address for the memory device based on determining whether to adjust the parameter associated with performing access operations received by the memory device.

In some examples, the parameter adjustment component 625 may modify a control voltage or a timing for a sense amplifier associated with the memory device based on determining whether to adjust the parameter associated with performing access operations received by the memory device. In some examples, the parameter adjustment component 625 may modify an internal voltage or an impedance trim associated with the component of the memory device based on determining whether to adjust the parameter associated with performing access operations received by the memory device. In some examples, the parameter adjustment component 625 may trigger a recalibration of the component based on determining whether to adjust the parameter associated with performing access operations received by the memory device.

Figure 7:
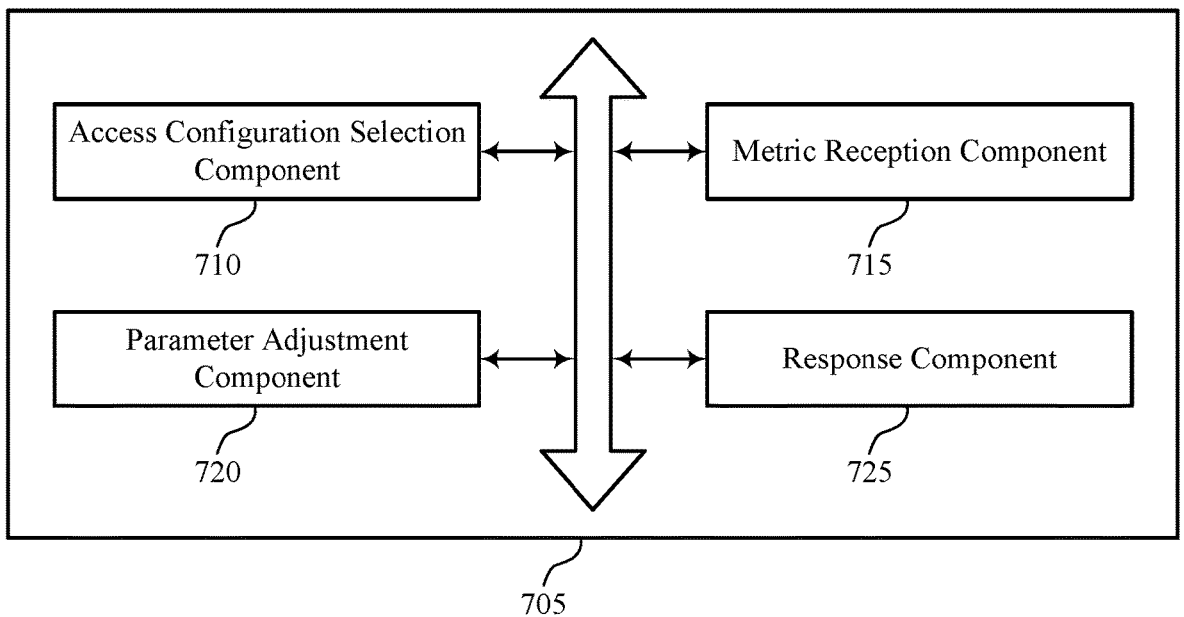
FIG. 7 shows a block diagram of a host device that supports monitoring and adjusting access operations at a memory device in accordance with examples as disclosed herein.

FIG. 7 shows a block diagram 700 of a host device 705 that supports monitoring and adjusting access operations at a memory device in accordance with examples as disclosed herein. The host device 705 may be an example of aspects of a host device as described with reference to FIGS. 1-5. The host device 705 may include an access configuration selection component 710, a metric reception component 715, a parameter adjustment component 720, and a response component 725. Each of these modules may communicate, directly or indirectly, with one another (e.g., via one or more buses).

The access configuration selection component 710 may select, at a first device, a configuration for managing access to a memory device. In some examples, the access configuration selection component 710 may transmit, to the memory device, an indication of the configuration for managing access to the memory device.

The metric reception component 715 may receive, from the memory device and according to the configuration, an indication of a metric related to an access operation for the memory device. In some examples, the metric reception component 715 may receive, from the memory device and according to the configuration, an indication of an access pattern of the memory device, where the metric includes the access pattern. In some examples, the metric reception component 715 may receive, from the memory device and according to the configuration, an indication of a level of wear of a component of the memory device, where the metric includes the level of wear.

The parameter adjustment component 720 may determine to adjust a parameter associated with performing access operations received by the memory device based on the metric. In some examples, the parameter adjustment component 720 may determine to adjust the parameter associated with performing access operations received by the memory device is based on the metric satisfying a threshold.

The response component 725 may transmit, to the memory device and based on determining to adjust the parameter, an indication to adjust the parameter associated with performing access operations received by the memory device.

Figure 8:
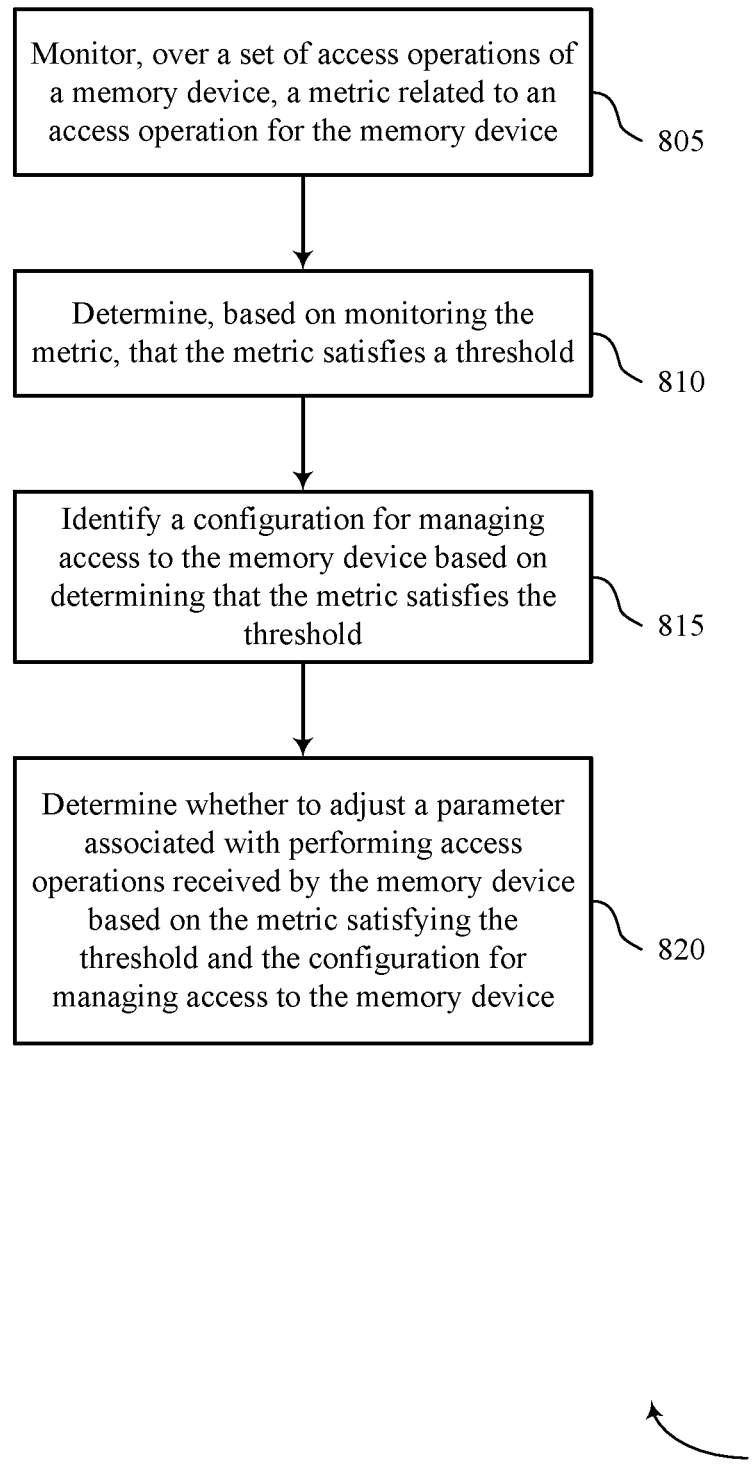
FIGS. 8 and 9 show flowcharts illustrating a method or methods that support monitoring and adjusting access operations at a memory device in accordance with examples as disclosed herein.

FIG. 8 shows a flowchart illustrating a method or methods 800 that supports monitoring and adjusting access operations at a memory device in accordance with examples as disclosed herein. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may monitor, over a set of access operations of a memory device, a metric related to an access operation for the memory device. The operations of 805 may be performed according to the methods described with reference to FIGS. 3-5. In some examples, aspects of the operations of 805 may be performed by a metric monitoring component as described with reference to FIG. 6.

At 810, the memory device may determine, based on monitoring the metric, that the metric satisfies a threshold. The operations of 810 may be performed according to the methods described with reference to FIGS. 3-5. In some examples, aspects of the operations of 810 may be performed by a threshold component as described with reference to FIG. 6.

At 815, the memory device may identify a configuration for managing access to the memory device based on determining that the metric satisfies the threshold. The operations of 815 may be performed according to the methods described with reference to FIGS. 3-5. In some examples, aspects of the operations of 815 may be performed by an access configuration component as described with reference to FIG. 6.

At 820, the memory device may determine whether to adjust a parameter associated with performing access operations received by the memory device based on the metric satisfying the threshold and the configuration for managing access to the memory device. The operations of 820 may be performed according to the methods described with reference to FIGS. 3-5. In some examples, aspects of the operations of 820 may be performed by a parameter adjustment component as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for monitoring, over a set of access operations of a memory device, a metric related to an access operation for the memory device, determining, based on monitoring the metric, that the metric satisfies a threshold, identifying a configuration for managing access to the memory device based on determining that the metric satisfies the threshold, and determining whether to adjust a parameter associated with performing access operations received by the memory device based on the metric satisfying the threshold and the configuration for managing access to the memory device.

Some examples of the method 800 and the apparatus described herein may further include operations, features, means, or instructions for transmitting, to a source external to the memory device and according to the configuration for managing access to the memory device, an indication of the metric, and receiving, from the source external to the memory device and based on transmitting the indication of the metric, an indication to adjust the parameter associated with performing access operations received by the memory device, where determining whether to adjust the parameter associated with performing access operations received by the memory device may be based on receiving the indication to adjust the parameter.

In some examples of the method 800 and the apparatus described herein, the metric represents an access pattern of the memory device over the set of access operations. In some examples of the method 800 and the apparatus described herein, the access pattern indicates a repeated access of an address of the memory device. Some examples of the method 800 and the apparatus described herein may further include operations, features, means, or instructions for modifying a mapping of a logical address to a physical address for the memory device based on determining whether to adjust the parameter associated with performing access operations received by the memory device.

Some examples of the method 800 and the apparatus described herein may further include operations, features, means, or instructions for modifying a control voltage or a timing for a sense amplifier associated with the memory device based on determining whether to adjust the parameter associated with performing access operations received by the memory device. In some examples of the method 800 and the apparatus described herein, the metric indicates a degradation in performance of a component of the memory device.

Some examples of the method 800 and the apparatus described herein may further include operations, features, means, or instructions for modifying an internal voltage or an impedance trim associated with the component of the memory device based on determining whether to adjust the parameter associated with performing access operations received by the memory device. Some examples of the method 800 and the apparatus described herein may further include operations, features, means, or instructions for triggering a recalibration of the component based on determining whether to adjust the parameter associated with performing access operations received by the memory device.

In some examples of the method 800 and the apparatus described herein, the metric represents a level of wear of a component of the memory device. Some examples of the method 800 and the apparatus described herein may further include operations, features, means, or instructions for determining the level of wear of the component based on a measurement of a property of the component with a sensor, where a stress on the component for each of the set of access operations exceeds a stress on a corresponding component in an access path for the set of access operations.

Figure 9:
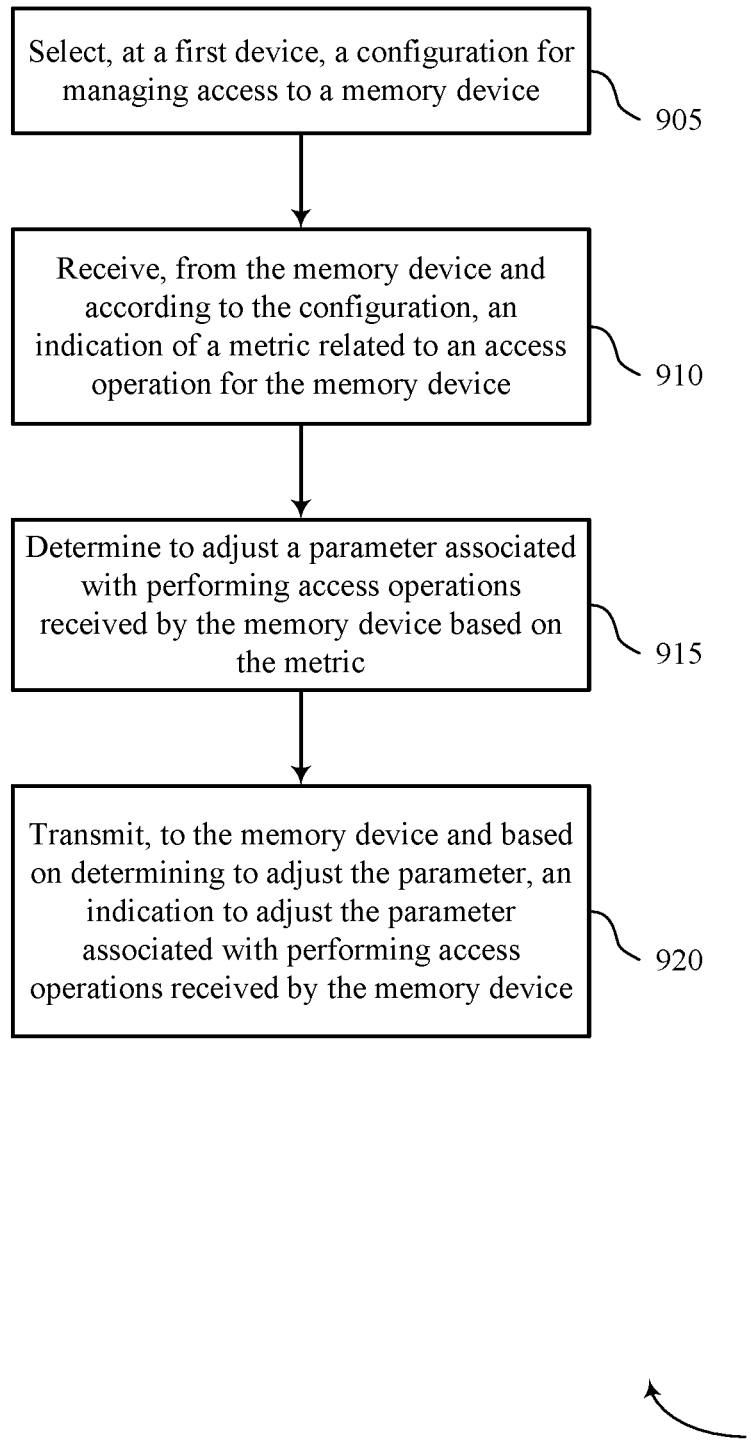

FIG. 9 shows a flowchart illustrating a method or methods 900 that supports monitoring and adjusting access operations at a memory device in accordance with examples as disclosed herein. The operations of method 900 may be implemented by a host device or its components as described herein. For example, the operations of method 900 may be performed by a host device as described with reference to FIG. 7. In some examples, a host device may execute a set of instructions to control the functional elements of the host device to perform the described functions. Additionally or alternatively, a host device may perform aspects of the described functions using special-purpose hardware.

At 905, the host device may select, at a first device, a configuration for managing access to a memory device. The operations of 905 may be performed according to the methods described with reference to FIGS. 3-5. In some examples, aspects of the operations of 905 may be performed by an access configuration selection component as described with reference to FIG. 7.

At 910, the host device may receive, from the memory device and according to the configuration, an indication of a metric related to an access operation for the memory device. The operations of 910 may be performed according to the methods described with reference to FIGS. 3-5. In some examples, aspects of the operations of 910 may be performed by a metric reception component as described with reference to FIG. 7.

At 915, the host device may determine to adjust a parameter associated with performing access operations received by the memory device based on the metric. The operations of 915 may be performed according to the methods described with reference to FIGS. 3-5. In some examples, aspects of the operations of 915 may be performed by a parameter adjustment component as described with reference to FIG. 7.

At 920, the host device may transmit, to the memory device and based on determining to adjust the parameter, an indication to adjust the parameter associated with performing access operations received by the memory device. The operations of 920 may be performed according to the methods described with reference to FIGS. 3-5. In some examples, aspects of the operations of 920 may be performed by a response component as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for selecting, at a first device, a configuration for managing access to a memory device, receiving, from the memory device and according to the configuration, an indication of a metric related to an access operation for the memory device, determining to adjust a parameter associated with performing access operations received by the memory device based on the metric, and transmitting, to the memory device and based on determining to adjust the parameter, an indication to adjust the parameter associated with performing access operations received by the memory device.

Some examples of the method 900 and the apparatus described herein may further include operations, features, means, or instructions for determining to adjust the parameter associated with performing access operations received by the memory device may be based on the metric satisfying a threshold. Some examples of the method 900 and the apparatus described herein may further include operations, features, means, or instructions for receiving, from the memory device and according to the configuration, an indication of an access pattern of the memory device, where the metric includes the access pattern.

Some examples of the method 900 and the apparatus described herein may further include operations, features, means, or instructions for receiving, from the memory device and according to the configuration, an indication of a level of wear of a component of the memory device, where the metric includes the level of wear. Some examples of the method 900 and the apparatus described herein may further include operations, features, means, or instructions for transmitting, to the memory device, an indication of the configuration for managing access to the memory device.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include one or more registers configured to store a configuration for managing access to the memory device and circuitry configured to monitor, over a set of access operations of the memory device, a metric related to an access operation for the memory device, determine, based on monitoring the metric, that the metric satisfies a threshold, and determine whether to adjust a parameter associated with performing access operations received by the memory device based on the configuration for managing access to the memory device and the metric satisfying the threshold.

Some examples may further include transmit, to a source external to the memory device and according to the configuration for managing access to the memory device, an indication of the metric, and receive, from the source external to the memory device and based on transmitting the indication of the metric, an indication to adjust the parameter associated with performing access operations received by the memory device, where determining whether to adjust the parameter associated with performing access operations received by the memory device may be based on receiving the indication to adjust the parameter.

Some examples may further include modifying a mapping of a logical address to a physical address for a component of the memory device based on determining whether to adjust the parameter associated with performing access operations received by the memory device. Some examples may further include modifying a control voltage or a timing for a sense amplifier associated with a component of the memory device based on determining whether to adjust the parameter associated with performing access operations received by the memory device.

Some examples may further include modifying an internal voltage or an impedance trim associated with a component of the memory device based on determining whether to adjust the parameter associated with performing access operations received by the memory device. Some examples may further include trigger a recalibration of a component of the memory device based on determining whether to adjust the parameter associated with performing access operations received by the memory device. Some examples may further include determining an access pattern of the memory device over the set of access operations, where the metric includes the access pattern.

In some examples, the circuitry further may include operations, features, means, or instructions for determine a level of wear of a component of the memory device based on a measurement of a property of the component, where the metric includes the level of wear. In some examples, a stress on the component for each of the set of access operations exceeds a stress on a corresponding component in an access path for the set of access operations.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate.

The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:
1. A method, comprising:
monitoring, over a plurality of access operations of a memory device, a metric related to an access operation for the memory device;

determining, based at least in part on monitoring the metric, that the metric satisfies a threshold;

identifying a configuration for managing access to the memory device based at least in part on determining that the metric satisfies the threshold;

transmitting, to a source external to the memory device and according to the configuration for managing access to the memory device, an indication of the metric; and determining whether to adjust a parameter associated with performing access operations received by the memory device based at least in part on the metric satisfying the threshold, the configuration for managing access to the memory device, and a received indication to adjust the parameter associated with performing access operations from the source external to the memory device.

2. The method of claim 1, further comprising:

receiving, from the source external to the memory device and based at least in part on transmitting the indication of the metric, the indication to adjust the parameter associated with performing access operations received by the memory device.

3. The method of claim 1, wherein the metric represents an access pattern of the memory device over the plurality of access operations.

4. The method of claim 3, wherein the access pattern indicates a repeated access of an address of the memory device.

5. The method of claim 4, further comprising:

modifying a mapping of a logical address to a physical address for the memory device based at least in part on determining whether to adjust the parameter associated with performing access operations received by the memory device.

6. The method of claim 4, further comprising:

modifying a control voltage or a timing for a sense amplifier associated with the memory device based at least in part on determining whether to adjust the parameter associated with performing access operations received by the memory device.

7. The method of claim 1, wherein the metric indicates a degradation in performance of a component of the memory device.

8. The method of claim 7, further comprising:

modifying an internal voltage or an impedance trim associated with the component of the memory device based at least in part on determining whether to adjust the parameter associated with performing access operations received by the memory device.

9. The method of claim 7, further comprising:

triggering a recalibration of the component based at least in part on determining whether to adjust the parameter associated with performing access operations received by the memory device.

10. The method of claim 1, wherein the metric represents a level of wear of a component of the memory device.

11. The method of claim 10, further comprising:

determining the level of wear of the component based at least in part on a measurement of a property of the component with a sensor, wherein a stress on the component for each of the plurality of access operations exceeds a stress on a corresponding component in an access path for the plurality of access operations.

12. A memory device, comprising:

one or more registers configured to store a configuration for managing access to the memory device; and circuitry configured to:

monitor, over a plurality of access operations of the memory device, a metric related to an access operation for the memory device;

determine, based at least in part on monitoring the metric, that the metric satisfies a threshold;

transmit, to a source external to the memory device and according to the configuration for managing access to the memory device, an indication of the metric; and determine whether to adjust a parameter associated with performing access operations received by the memory device based at least in part on the configuration for managing access to the memory device, the metric satisfying the threshold, and a received indication to adjust the parameter associated with performing access operations from the source external to the memory device.

13. The memory device of claim 12, wherein the circuitry is further configured to:

receive, from the source external to the memory device and based at least in part on transmitting the indication of the metric, the indication to adjust the parameter associated with performing access operations received by the memory device.

14. The memory device of claim 12, wherein the circuitry is further configured to:

modify a mapping of a logical address to a physical address for a component of the memory device based at least in part on determining whether to adjust the parameter associated with performing access operations received by the memory device.

15. The memory device of claim 12, wherein the circuitry is further configured to:

modify a control voltage or a timing for a sense amplifier associated with a component of the memory device based at least in part on determining whether to adjust the parameter associated with performing access operations received by the memory device.

16. The memory device of claim 12, wherein the circuitry is further configured to:

modify an internal voltage or an impedance trim associated with a component of the memory device based at least in part on determining whether to adjust the parameter associated with performing access operations received by the memory device.

17. The memory device of claim 12, wherein the circuitry is further configured to:

trigger a recalibration of a component of the memory device based at least in part on determining whether to adjust the parameter associated with performing access operations received by the memory device.

18. The memory device of claim 12, wherein the circuitry is further configured to:

determine an access pattern of the memory device over the plurality of access operations, wherein the metric comprises the access pattern.

19. The memory device of claim 12, wherein the circuitry further comprises a sensor configured to:

determine a level of wear of a component of the memory device based at least in part on a measurement of a property of the component, wherein the metric comprises the level of wear.

20. The memory device of claim 19, wherein a stress on the component for each of the plurality of access operations exceeds a stress on a corresponding component in an access path for the plurality of access operations.

21. A method, comprising:
selecting, at a device external to a memory device, a configuration for managing access to the memory device;
receiving, from the memory device and according to the configuration, an indication of a metric related to an access operation for the memory device;
determining to adjust a parameter associated with performing access operations received by the memory device based at least in part on the metric; and
transmitting, to the memory device and based at least in part on determining to adjust the parameter, an indication to adjust the parameter associated with performing access operations received by the memory device.

22. The method of claim 21, wherein:
determining to adjust the parameter associated with performing access operations received by the memory device is based at least in part on the metric satisfying a threshold.

23. The method of claim 21, further comprising:
receiving, from the memory device and according to the configuration, an indication of an access pattern of the memory device, wherein the metric comprises the access pattern.

24. The method of claim 21, further comprising:
receiving, from the memory device and according to the configuration, an indication of a level of wear of a component of the memory device, wherein the metric comprises the level of wear.

25. The method of claim 21, further comprising:
transmitting, to the memory device, an indication of the configuration for managing access to the memory device.

* * * * *